US008061223B2

(12) United States Patent
Pan

(10) Patent No.: US 8,061,223 B2
(45) Date of Patent: Nov. 22, 2011

(54) TESTING APPARATUS FOR TOUCH SCREEN

(75) Inventor: Chiang-Fu Pan, Tu-Cheng (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 652 days.

(21) Appl. No.: 12/235,712

(22) Filed: Sep. 23, 2008

(65) Prior Publication Data

US 2009/0241701 A1 Oct. 1, 2009

(30) Foreign Application Priority Data

Mar. 28, 2008 (CN) .......................... 2008 1 0300765

(51) Int. Cl.
*G01M 7/00* (2006.01)

(52) U.S. Cl. ...................................................... 73/865.3

(58) Field of Classification Search ........................ None
See application file for complete search history.

(56) References Cited

U.S. PATENT DOCUMENTS 3,597,981 A * 8/1971 Wakabayashi et al. ...... 73/865.9
6,304,830 B1 * 10/2001 Lee .............................. 702/114
6,581,483 B1 * 6/2003 Yeh ............................ 73/865.3

* cited by examiner

*Primary Examiner* — Robert Raevis
(74) *Attorney, Agent, or Firm* — Altis Law Group, Inc.

(57) ABSTRACT

A testing apparatus (100) for testing a touch screen used in an electronic device is described. The testing apparatus includes a base (20), a testing device (13), a holding mechanism (10), and a control module (12). The testing device includes a testing platform (131) carrying the touch screen, a positioning board (133) and testing members (135) positioned on the positioning board. The holding mechanism is operatable to hold the touch screen on the testing platform during the testing members testing the touch screen. The control module can control the testing members to test the touch screen.

19 Claims, 7 Drawing Sheets

TESTING APPARATUS FOR TOUCH SCREEN

BACKGROUND

1. Field of the Invention

The invention relates to testing apparatuses, particularly, testing apparatus used for testing touch screens.

2. Description of Related Art

Touch screens have been widely used in portable electronic devices (e.g., mobile phones). The touch screens usually need to be tested, which is typically carried our manually by test operators using touching pens.

Specifically, the touching pen is operated to touch the touch screen. If the touch screen has some area not workable and the area is touched by the touching pen, the area will be identified by an electronically-controlled system giving an alarm-like signal. The touch pen electrically connects the electronically-controlled system. However, this testing method is time-consuming and prone to error after the repeated operations.

Therefore, there is room for improvement within the art.

BRIEF DESCRIPTION OF THE DRAWINGS

Many aspects of the exemplary testing apparatus for touch screens can be better understood with reference to the following drawings. These drawings are not necessarily drawn to scale, the emphasis instead being placed upon clearly illustrating the principles of the exemplary testing apparatus. Moreover, in the drawings like reference numerals designate corresponding parts throughout the several views. Wherever possible, the same reference numbers are used throughout the drawings to refer to the same or like elements of an embodiment.

DETAILED DESCRIPTION OF THE EMBODIMENTS

Figure 1:
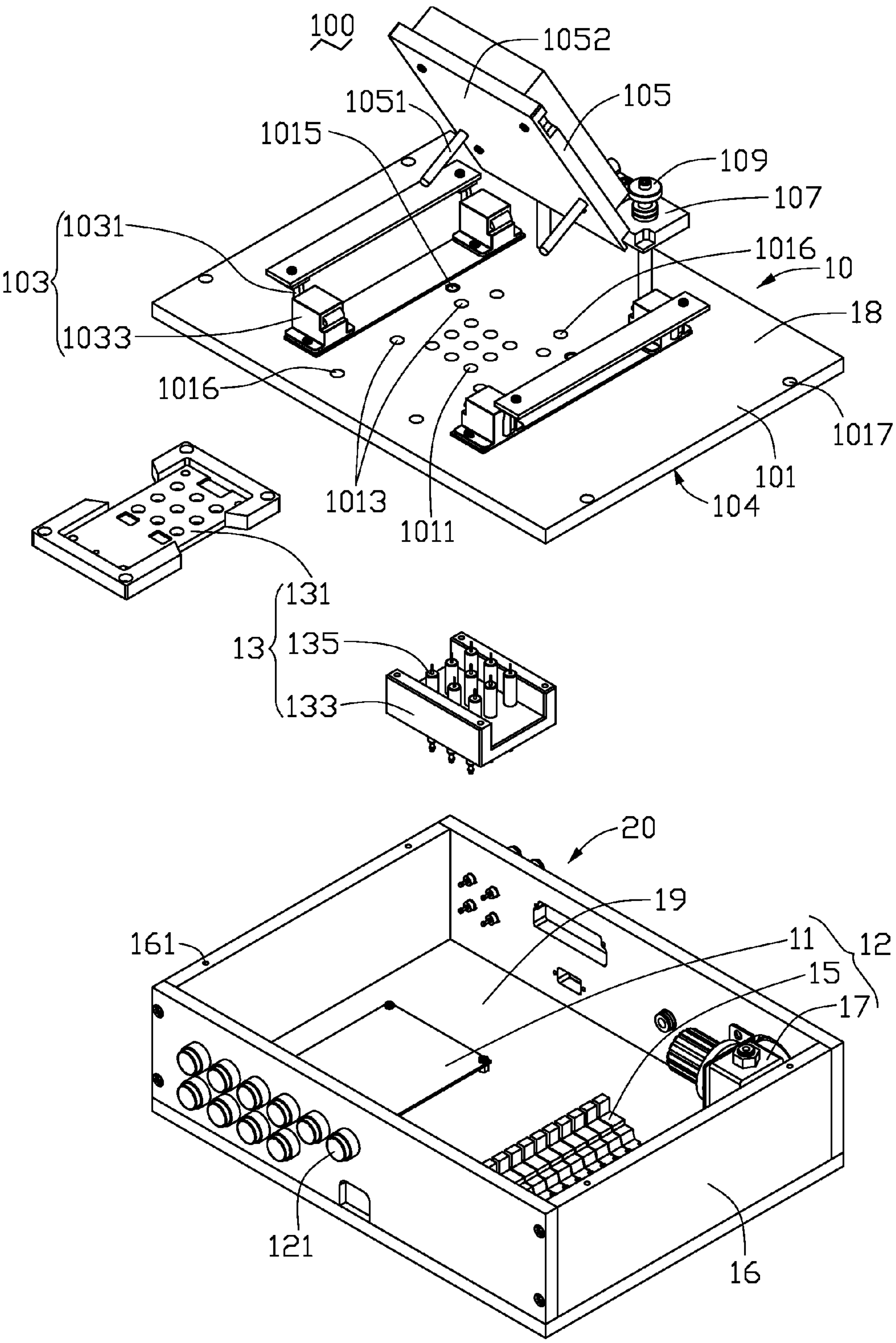
FIG. 1 is an exploded view of a testing apparatus according to an exemplary embodiment.
Figure 2:
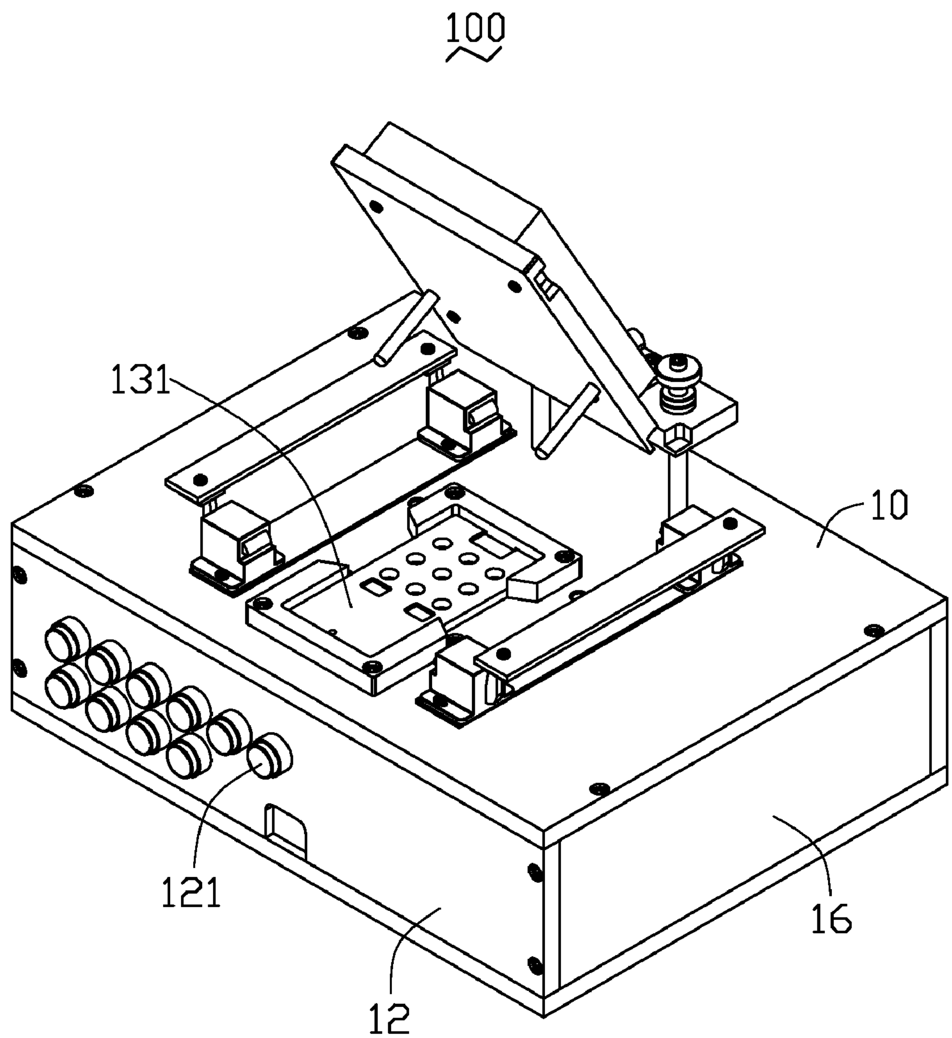
FIG. 2 is an assembled view of the testing apparatus shown in FIG. 1.
Figure 3:
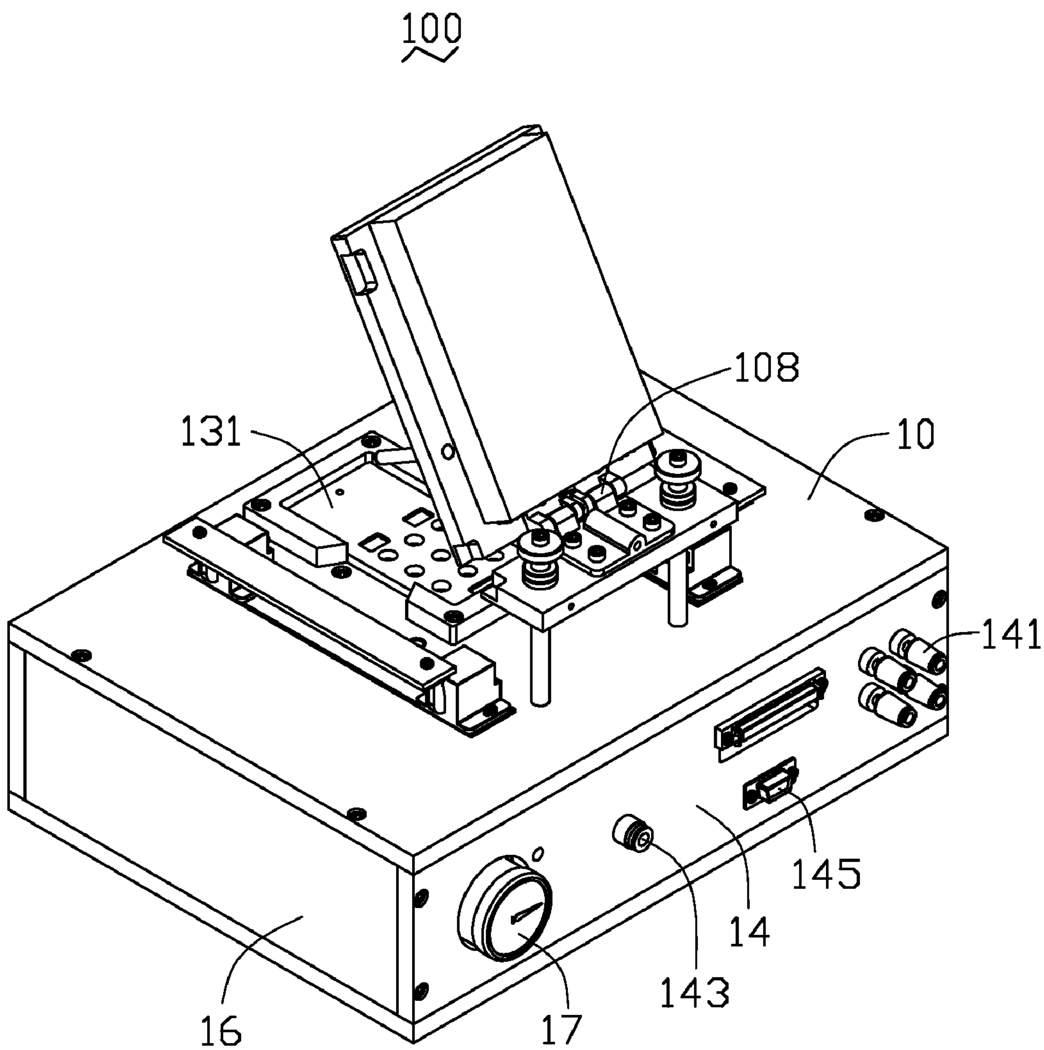
FIG. 3 is similar to FIG. 2 showing another aspect thereto.

FIGS. 1 through 3 show a testing apparatus 100 including a holding mechanism 10, a control module 12, a testing device 13 and a base 20. The base 20 has four side boards 16, an upper board 18, and a lower board 19. The four side boards 16, the upper board 18 and the lower board 19 cooperatively define a chamber (not labeled) to receive the control module 12 and part of the testing device 13 (shown in FIG. 2) therein. Power buttons 121 are defined at one of the side boards 16. A power interface 141, a data interface 145, an air input interface 143 and an air pressure regulator 17 are defined at another one of the side boards 16.

The upper board 18 defines a plurality of holes which includes first testing holes 1011, first mounting holes 1013, second mounting holes 1016, third mounting holes 1017, and engaging holes 1015. The number of any particular type of hole can vary. The first testing holes 1011 are arranged and distributed evenly in a central square area of the upper board 18. The first mounting holes 1013 can be adjacent to the vertices of the first testing holes 1011. The second mounting holes 1016 can be adjacent to the mounting hole 1013 respectively. The mounting holes 1017 can be near four corners of the upper board 1018. The engaging holes 1015 are arranged between the third mounting holes 1017 and the first mounting holes 1013. The mounting holes 1013, 1016, and 1017 can be screw holes.

The holding mechanism 10 is securely mounted on the upper board 18 and, includes two parallel positioning members 103, a rotatable holding member 105, a base member 107, and two fixing members 109. The positioning members 103 are securely attached to the upper board 18 by screws. The first testing holes 1011, the mounting holes 1013 and 1016, and the engaging holes 1015 are located between the two positioning members 103. Each positioning member 103 includes two positioning portions 1031 and two supporting portions 1033. The supporting portions 1033 are generally cubic and have generally flat surfaces to support the PCBs. The positioning portions 1031 are generally L-shaped and, by choosing one mounting hole 1013 as a reference point, extend upwardly from the distal side ends of the supporting portions 1033. The positioning portions 1031 are configured to position the supported PCBs therebetween.

The base member 107 is fixed relative to the upper board 18 by fixing the fixing members 109 to the upper board 18. The base member 107 is above the upper board 18. The holding member 105 is a step-shaped board rotatably connecting to the end of the base member 107 by a conventional hinge 108 (best shown in FIG. 3). The holding member 105 includes two engaging columns 1051 protruding toward the upper board 18. The engaging columns 1051 correspond to the engaging holes 1015, and are configured for engaging with the engaging holes 1015. The holding member 105 can rotate from a standby position (best shown in FIGS. 2 and 3) to a holding position by the hinge 108. Further, at the standby position, the holding member 105 is biased by the hinge 108 away from the upper board 18 with a certain angle between a holding surface 1052 of the holding member 105 and the upper board 18. At the holding position, the holding member 105 rotates to make the holding surface 1052 parallel to the upper board 18. The holding member 105 is secured at this position by the biasing force of the hinge 108. The engaging columns 1051 engage into the engaging holes 1015.

Figure 4:
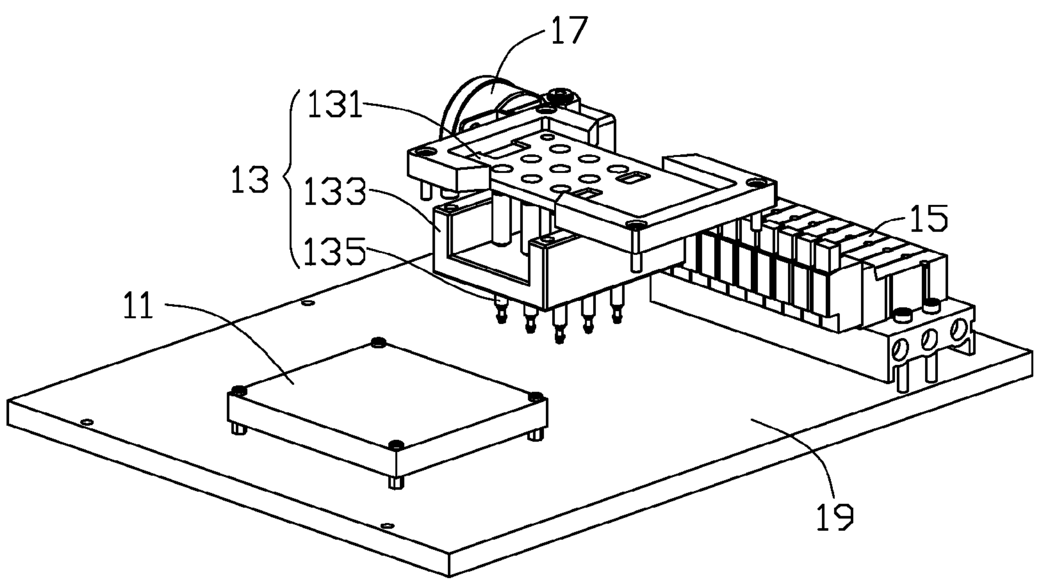
FIG. 4 is an isometric view of parts of the testing apparatus in FIG. 1, including a lower board, a control module, and a testing mechanism.
Figure 5:
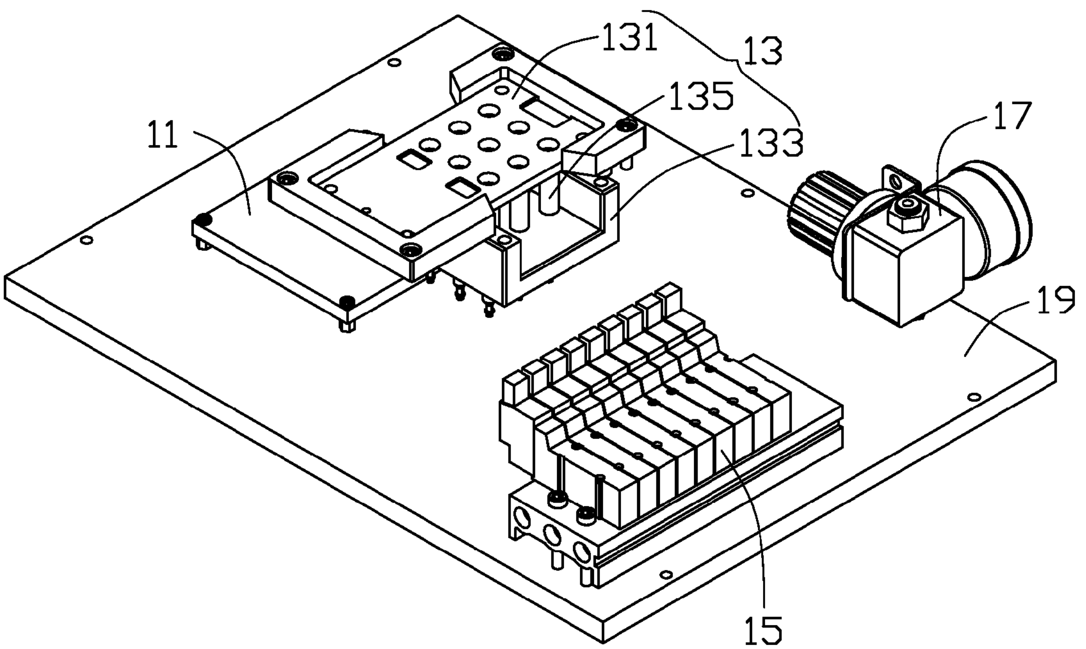
FIG. 5 is similar to FIG. 4 showing another aspect thereto.
Figure 6:
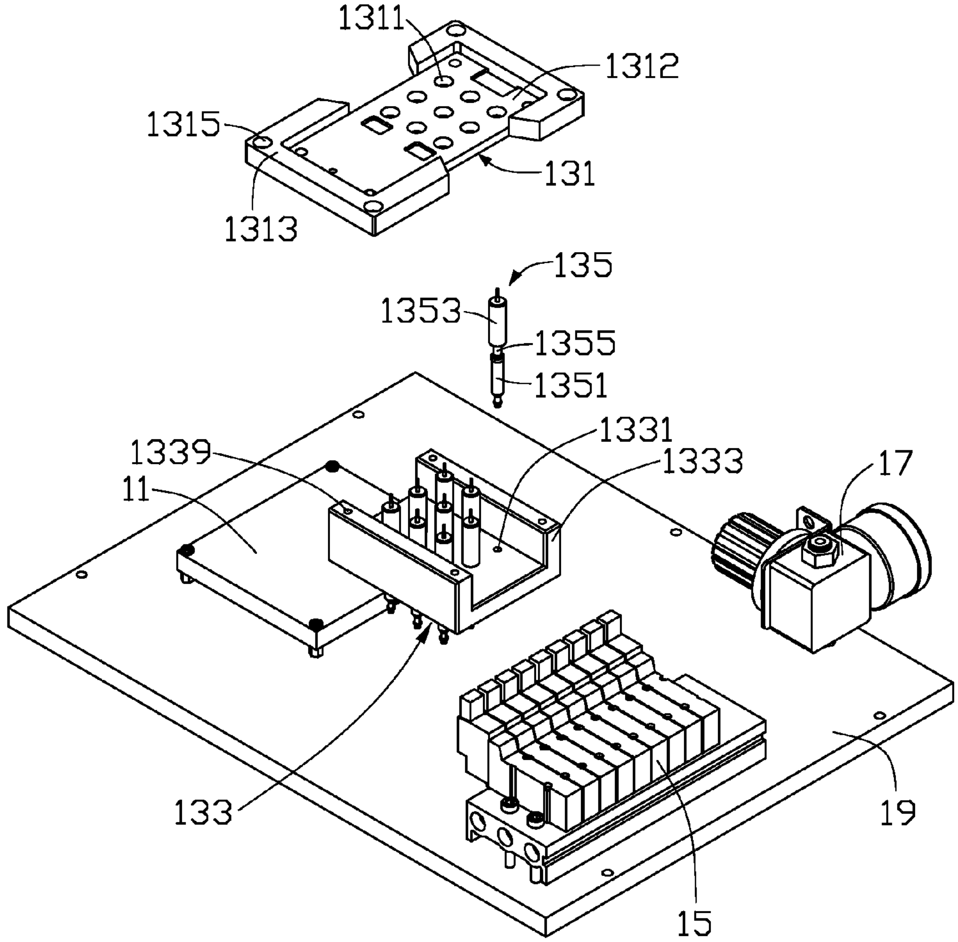
FIG. 6 is similar to FIG. 5 except for exploding the testing mechanism.

Referring also to FIGS. 4 through 6, the control module 12 is mounted on the lower board 19 of the base 20. The testing device 13 is mounted on the upper board 18 of the base 20 (FIG. 2). The control module 12 includes a controller 11, a group of electromagnetic valves 15 and the air pressure regulator 17. The controller 11 electrically connects to the electromagnetic valves 15. The electromagnetic valves 15 connect the testing device 13 and the air pressure regulator 17 by pipes. The air pressure regulator 17 connects to an air source (not shown) by pipes. Thus, the air source supplies air through the pipes into the testing device 13. The testing device 13 can be electrically controlled by the controller 11, and further pneumatically controlled by the electromagnetic valves 15 and the air pressure regulator 17. Specifically, the controller 11 can receive operation commands, e.g., from an external computer (not shown) through the data interface 145. Then, the controller 11 can control the particular operation of which one of the electromagnetic valves 15. The particular operation of the electromagnetic valve 15 enables a particular test operation of the testing device 13. The air pressure regulator 17 functions to control the strength of the test operation by controlling the supplied air pressure.

The testing device 13 has a testing platform 131, a positioning board 133 and a group of testing members 135. The testing platform 131 and the positioning board 133 are securely mounted on the upper board 18, and the testing members 135 are secured within the positioning board 133. The testing platform 131 is positioned between the upper board 18 and the positioning board 133.

Referring to FIG. 6, the testing platform 131 is generally recessed including a flat carrying portion 1312 and two edge portions 1313 surrounding the carrying portion 1312. The carrying portion 1312 defines a plurality of second testing holes 1311 corresponding to the first testing holes 1011. The edge portions 1313 define four mounting holes 1315 corresponding to the mounting holes 1016 of the upper board 18. The testing platform 131 can be securely attached to the upper board 18 by a fixing means (e.g., screws) engaging into the mounting holes 1315 and 1016, respectively.

The positioning board 133 is bridge-shaped having a plurality of positioning holes 1331, a groove 1333 and four mounting holes 1339. The positioning holes 1331 correspond to the second testing holes 1311. The groove 1333 accommodates the testing members 135 in there. The mounting holes 1339 correspond to the mounting holes 1013 of the upper board 18, so that the positioning board 133 can be securely attached to the upper board 18 by fixing means (e.g., screws) engaging into the mounting holes 1339 and 1013, respectively.

Figure 7:
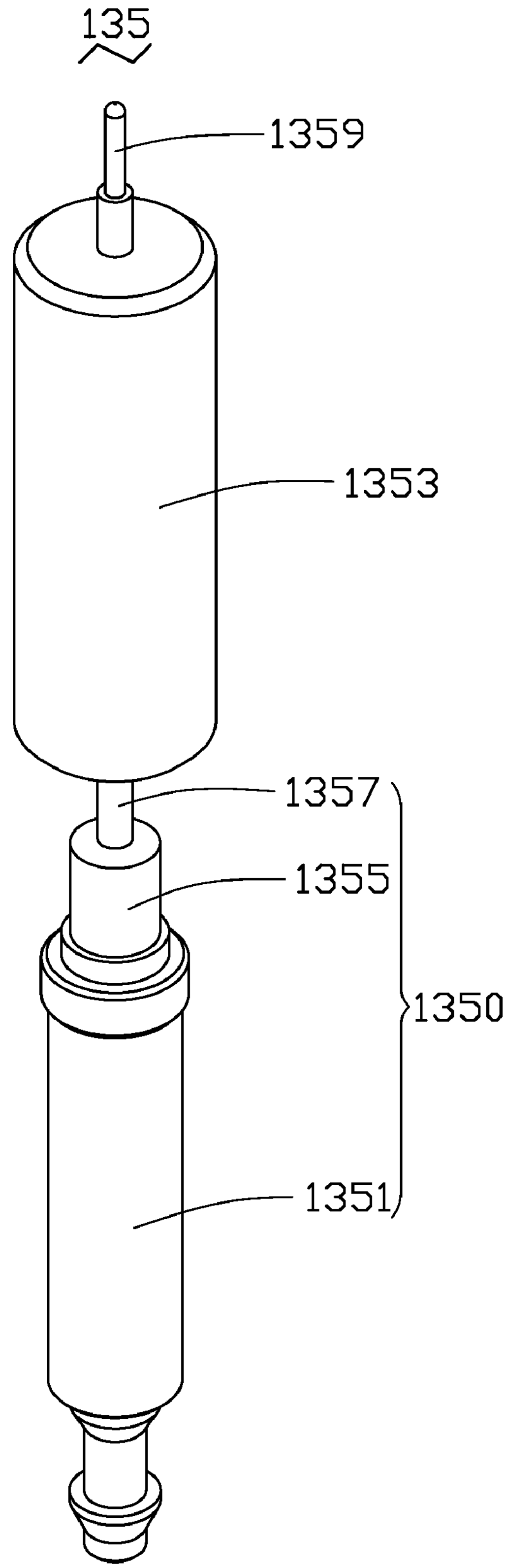
FIG. 7 is an isometric view of one of testing members shown in FIG. 6.

The testing members 135 correspond to the positioning holes 1331. The testing members 135 are positioned within the groove 1333 by the positioning holes 1331 and, further connect with the electromagnetic valves by pipes. Referring also to FIG. 7, the testing member 135 includes a driving mechanism 1350 and a testing pen 1353. The driving mechanism 1350 connects the testing pen 1353 and is configured for driving the testing pen 1353 to test the touch screen.

The driving mechanism 1350 has a pneumatically cylinder 1351 connecting to the electromagnetic valve 15 by the pipe, and a driving piston 1357 partially received in the pneumatically cylinder 1351. The pneumatically cylinder 1351 has a positioning portion 1355 positioned in the positioning hole 1331, thereby positioning the pneumatically cylinder 1351 on the positioning board 133. The driving piston 1357 has an exposed portion, which is not received in the pneumatically cylinder 1351, connecting to the testing pen 1353. The driving piston 1357 can be controlled to move back and forth within the cylinder 1351.

The testing pen 1353 is generally cylindrical and configured for passing through the first testing holes 1011 of the upper board 18 and the second testing holes 1311 of the testing device 13. The testing pen 1353 includes a testing pin 1359 for passing through first testing holes 1011 and the second testing holes 1311 to touch the touch screen.

Referring back to FIGS. 1 through 3 and 6, during assembly of the testing apparatus 100, the control module 12 is mounted within the base 20. The testing platform 131 is fixed to the upper board 18 facing the holding member 105. The second testing holes 1311 of the testing platform 131 align with the first testing holes 1011 of the upper board 18. The testing members 135 are positioned to the positioning board 133. The testing pens 1353 are positioned in the groove 1333 of the positioning board 133. The positioning board 133 combined with the testing members 135 are securely attached to the upper board 18 and thus is separated by the upper board 18 from the testing platform 131. The testing pens 1353 align with first testing holes 1011 and the second testing holes 1311 respectively. The upper board 18 is fixed to the sideboards 16 of the base 20. The base 20 accommodates the positioning board 133 and the testing members 135 therein. The controller electrically connects with the electromagnetic valves 15. The electromagnetic valves 15 pneumatically connect with the pneumatically cylinders 1351 and the air pressure regulator 17.

In using the testing apparatus 100, the touch screen is placed and then carried by the carrying portion 1312 of the testing platform 131. At this time, the PCB holding the touch screen is supported by the supporting portions 1033 of the positioning member 103, and simultaneously positioned by the positioning portions 1031 of the positioning member 103. The holding member 105 rotates from the standby position to the holding position and, thus holds the PCB and the touch screen on the supporting portions 1033 and the carrying portion 1312 respectively. After that, the controller 11 receives operation commands to control one or more electromagnetic valves 15. The electromagnetic valves 15 work then drive the driving pistons 1357 to move accordingly. During this stage, the testing pens 1353 move along the driving pistons 1357. Thus, the testing pins 1359 pass through the first testing holes 1011 and the second testing holes 1311 to touch the touch screen. The strength of the touching test is adjusted by the air pressure regulator 17. The testing process can be precisely and accurately controlled.

It is to be understood, however, that even through numerous characteristics and advantages of the exemplary invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A testing apparatus for testing a touch screen used in an electronic device, comprising:

a base;

a testing device comprising:

a testing platform mounted on the base and configured for carrying the touch screen;

a positioning board mounted on the base; and a plurality of testing members positioned on the positioning board;

a holding mechanism mounted on the base and configured to hold the touch screen on the testing platform during the testing members testing the touch screen, the holding mechanism comprising a holding member, a base member, and a hinge, the base member being fixed to the base, the holding member rotatable connecting to the base member by the hinge; and a control module mounted on the base and configured for controlling the testing members to test the touch screen.

2. The testing apparatus as claimed in claim 1, wherein the testing of the touch screen is pneumatically driven.

3. The testing apparatus as claimed in claim 2, wherein the control module comprises a controller and a plurality of electromagnetic valves corresponding to the plurality of the testing members, the controller electrically connecting with the electromagnetic valves and configured for controlling operation of the electromagnetic valves, the electromagnetic valves configured for controlling touch testing by the testing members.

4. The testing apparatus as claimed in claim 3, wherein the electromagnetic valves connect with the testing members.

5. The testing apparatus as claimed in claim 4, wherein the control module further comprises an air pressure regulator configured for adjusting the strength of the testing members.

6. The testing apparatus as claimed in claim 4, wherein the testing members each comprises a driving mechanism and a testing pen, the driving mechanism connecting the testing pen and being pneumatically driven to drive the testing pen to test the touch screen.

7. The testing apparatus as claimed in claim 6, wherein the driving mechanism comprises a pneumatically cylinder connecting to the electromagnetic valve, and a driving piston connecting to the testing pen, the driving piston controlled by the electromagnetic valve to move back and forth within the cylinder.

8. The testing apparatus as claimed in claim 7, wherein the testing pen comprises a testing pin configured for testing the touch screen.

9. The testing apparatus as claimed in claim 8, wherein the base comprises:

an upper board defining a plurality of first testing holes;

the testing platform defining a plurality of second testing holes aligning with the first testing holes;

the testing pens positioned between the positioning board and the upper board, the upper board positioned between the testing platform and the positioning board; and the testing pins configured for passing through the first and second testing holes.

10. The testing apparatus as claimed in claim 1, wherein the base comprises an upper board, and the holding member is configured for rotating from a standby position to a holding position by the hinge, whereas:

at the standby position, the holding member is away from the upper board;

at the holding position, the holding member rotates to be parallel to the upper board, the holding member holding the touch screen on the testing platform.

11. The testing apparatus as claimed in claim 10, wherein the holding member comprises an engaging column, the upper board defines an engaging hole, the engaging column engages into the engaging hole when holding member is at the holding position.

12. The testing apparatus as claimed in claim 10, wherein the holding mechanism further comprise two positioning members for positioning a printed circuit board, the printed circuit board associated with the touch screen, the positioning members comprising:

two supporting portions configured for supporting the printed circuit board; and two positioning portions configured for positioning the printed circuit board therebetween.

13. A testing apparatus for testing a touch screen used in an electronic device, comprising:

a hollow base;

a pneumatically driven testing device comprising:

a testing platform mounted at outside of the base and configured for carrying the touch screen;

a positioning board mounted within the base; and a plurality of testing members positioned on the positioning board and within the base and, be movable to test the touch screen;

a holding mechanism mounted at the outside of the base and be rotatably to hold the touch screen on the testing platform during the testing members testing the touch screen; and a control module mounted within the base and configured for electrically controlling the movement of the testing members.

14. The testing apparatus as claimed in claim 13, wherein the control module comprises a controller and a plurality of electromagnetic valves corresponding to the plurality of the testing members, the controller electrically connecting with the electromagnetic valves and configured for controlling operation of the electromagnetic valves, the electromagnetic valves configured for controlling touching test of the testing members.

15. The testing apparatus as claimed in claim 14, wherein the control module further comprises an air pressure regulator configured for adjusting strength of the touching test of the testing members.

16. The testing apparatus as claimed in claim 15, wherein the testing members each comprises a driving mechanism and a testing pen, the driving mechanism comprises a pneumatically cylinder connecting to the electromagnetic valve, and a driving piston connecting to the testing pen, the driving piston controlled by the electromagnetic valve to move back and forth within the cylinder.

17. The testing apparatus as claimed in claim 16, wherein the testing pen comprise a testing pin configured for testing the touch screen, the base comprises:

an upper board defining a plurality of first testing holes;

the testing platform defining a plurality of second testing holes aligning with the first testing holes;

the testing pens positioned between the positioning board and the upper board, the upper board positioned between the testing platform and the positioning board; and the testing pins configured for passing through the first and second testing holes.

18. The testing apparatus as claimed in claim 13, wherein the base comprises an upper board, the holding mechanism comprise:

a rotary means;

a holding member rotatably connecting to the base member by the rotary means; and a base member fixed to the base;

wherein the holding member is configured for rotating from a standby position to a holding position by the hinge, whereas:

at the standby position, the holding member is away from the upper board;

at the holding position, the holding member rotates to be parallel to the upper board, the holding member holding the touch screen on the testing platform.

19. The testing apparatus as claimed in claim 18, wherein the holding member comprises an engaging column, the upper board defines an engaging hole, the engaging column engages into the engaging hole when holding member is at the holding position.

* * * * *